United States Patent
Zou et al.

(10) Patent No.: US 10,108,063 B2
(45) Date of Patent: Oct. 23, 2018

(54) IN-CELL TOUCH LIQUID CRYSTAL PANEL AND ARRAY SUBSTRATE THEREOF

(71) Applicant: Wuhan China Star Optoelectronics Technology Co., Ltd., Wuhan, Hubei (CN)

(72) Inventors: Gonghua Zou, Wuhan (CN); Ying-chi Wang, Wuhan (CN); Chun-hung Huang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 123 days.

(21) Appl. No.: 15/117,651

(22) PCT Filed: May 24, 2016

(86) PCT No.: PCT/CN2016/083072
§ 371 (c)(1),
(2) Date: Aug. 9, 2016

(87) PCT Pub. No.: WO2017/190381
PCT Pub. Date: Nov. 9, 2017

(65) Prior Publication Data
US 2018/0113364 A1    Apr. 26, 2018

(30) Foreign Application Priority Data
May 4, 2016   (CN) .......................... 2016 1 0288721

(51) Int. Cl.
*G02F 1/1333*    (2006.01)
*G02F 1/1362*    (2006.01)
(Continued)

(52) U.S. Cl.
CPC .... *G02F 1/136286* (2013.01); *G02F 1/13338* (2013.01); *G06F 3/041* (2013.01);
(Continued)

(58) Field of Classification Search
CPC ........... G02F 1/13338; G02F 1/136286; G06F 3/0416; G06F 3/0412; G06F 2203/04103;
(Continued)

(56) References Cited

U.S. PATENT DOCUMENTS 9,146,436 B2    9/2015 Han et al.
2015/0042612 A1*    2/2015 Lee .................. G02F 1/13338
                                                345/174
(Continued)

FOREIGN PATENT DOCUMENTS

CN    201886234    6/2011
CN    102810035    12/2012
(Continued)

OTHER PUBLICATIONS

International Search Report for PCT/CN2016/083072, Completed by the Chinese Patent Office dated Jan. 9, 2017, 12 Pages.

*Primary Examiner* — Jia Pan
(74) *Attorney, Agent, or Firm* — Mintz Levin Cohn Ferris Glovsky and Popeo, P.C.; Kongsik Kin; Jhongwoo Jay Peck

(57) ABSTRACT

An in-cell touch liquid crystal panel and an array substrate thereof, and the array substrate includes a glass substrate and three metal layers, and a common electrode layer that are sequentially formed on the glass substrate and are insulated with each other. A plurality of scan lines are disposed in the second metal layer, a plurality of connection wirings are disposed in the third metal layer, and a common electrode layer is divided into a plurality of touch control inductive electrodes that are electrically connected to a touch control
(Continued)

detection chip through the connection wirings. A plurality of metal lines are disposed in the second metal layer, the metal lines and the scan lines are insulated with each other, and two ends of each metal line are electrically connected to the connection wiring.

16 Claims, 5 Drawing Sheets

(51) Int. Cl.
*H01L 27/12* (2006.01)
*G06F 3/041* (2006.01)
*G06F 3/044* (2006.01)

(52) U.S. Cl.
CPC ............ *G06F 3/044* (2013.01); *G06F 3/0412* (2013.01); *H01L 27/124* (2013.01); *G06F 2203/04111* (2013.01)

(58) Field of Classification Search
CPC ............ G06F 2203/04111; G06F 3/044; H01L 27/124
See application file for complete search history.

(56) References Cited

U.S. PATENT DOCUMENTS

| | | |
|---|---|---|
| 2015/0185572 A1 | 7/2015 | Han et al. |
| 2016/0253023 A1* | 9/2016 | Aoyama ............... G06F 3/0416 345/174 |
| 2016/0259445 A1* | 9/2016 | Yang ........................ G06F 3/044 |

FOREIGN PATENT DOCUMENTS

| | | |
|---|---|---|
| CN | 104571768 A | 4/2015 |
| CN | 204706018 | 10/2015 |
| CN | 105138184 | 12/2015 |
| CN | 105468202 | 4/2016 |
| WO | 2015096203 | 7/2015 |

* cited by examiner

IN-CELL TOUCH LIQUID CRYSTAL PANEL AND ARRAY SUBSTRATE THEREOF

CROSS-REFERENCE TO RELATED APPLICATION

This application is the U.S. national phase of PCT Application No. PCT/CN2016/083072 filed on May 24, 2016, which claims priority to CN Patent Application No. 201610288721.6 filed on May 4, 2016, the disclosures of which are incorporated in their entirety by reference herein.

TECHNICAL FIELD

The present invention relates to a touch control technical field, and more particularly to an in-cell touch liquid crystal panel and an array substrate thereof.

BACKGROUND ART

A touch display screen, as an input media, is a simplest and convenient human-computer interaction method at present, and thus, touch display screens are applied to various electronic products increasingly. Based on different working principles and media for transmitting information, the products having touch screens can be classified into four kinds as follows: an infrared touch screen, a capacitive touch screen, a resistive touch screen, and a surface acoustic wave touch screen; wherein the capacitive touch screen becomes a current mainstream touch screen technology for its advantages such as long lifespan, high transmittance, capable of supporting multi-touch. The capacitive touch screen includes a surface capacitive touch screen and a projected capacitive touch screen, wherein the projected capacitive touch screen also can be classified into a self-capacitive touch screen and a mutual capacitive touch screen. A self capacitive touch structure has a higher touch inductive accuracy and a higher signal-to-noise ratio, thereby being preferred by all panel manufacturers.

At present, the self capacitive touch structure uses a self capacitive principle to realize detecting finger touch positions, in specific: a plurality of self capacitive electrodes that are disposed in the same layer and insulated with each other are disposed in the touch structure, when a human body does not touch the screen, a capacitance value born by each self capacitive electrode is a fixed value, and when the human body touches the screen, a capacitance born by the self capacitive electrode corresponding to the touch position is a sum of a fixed value and a human body capacitance. A touch control detection chip may judge the touch position by detecting a capacitance value change of each self capacitive electrode in a touch period.

Regarding the self capacitive in-cell touch screen, in general, touch control inductive electrodes and metal connection lines in a touch screen structure are directly disposed on an array substrate or a filter substrate. FIG. 1 is a structure diagram of an array substrate having a touch screen structure. As shown in FIG. 1, the array substrate includes a glass substrate 1 and a first metal layer 2, an insulating layer 3a, a second metal layer 4, a second insulating layer 3b, a common electrode layer 5, a third insulating layer 3c, a third metal layer 6, a fourth insulating layer 3d and a pixel electrode layer 7 that are laminated on the glass substrate 1 in sequence. Wherein, a plurality of scan lines are disposed in the first metal layer 2, a plurality of data lines are disposed in the second metal layer 4, and the scan lines and the data lines are vertical to each other in a wiring direction.

Wherein, referring to FIGS. 1 and 2, the common electrode layer 5 is divided into a plurality of touch control inductive electrodes 5a that are distributed in an array, a plurality of metal connection lines 6a are disposed in the third metal layer 6, and each touch control inductive electrode 5a is connected to a touch control detection chip 8 through an independent metal connection wire 6a. In specific, in order not to affect an aperture rate of a display area, the wiring direction of the metal connection line 6a is disposed to be the same as that of the data line, and a projection, of the metal connection line 6a located in the third metal layer 6, in the second metal layer 4 should be overlapped with the data line. Furthermore, the touch control inductive electrode 5a is electrically connected with the corresponding metal connection line 6a through a through hole (not shown in the figures) located in the third insulating layer 3c, and regarding a series of touch control inductive electrodes 5a, each metal connection line 6a is not connected with the previous touch control inductive electrode before being connected with the corresponding touch control inductive electrodes 5a, and the metal connection line 6a will not be continuously connected with the later touch control inductive electrode after being connected with the corresponding touch control inductive electrodes 5a. Wherein, since the common electrode layer 5 is also used as a touch control inductive electrode 5a, within a display time of one frame, the common electrode layer 5 (the touch control inductive electrode 5a) transfers common voltage ($V_{com}$) and touch control signals in time-sharing.

As described in the above structure of the touch screen, a touch control sensitivity is relevant to a wiring resistance of the metal connection line 6a and a self capacitance of the touch control inductive electrode 5a, in order to avoid writing and reading a touch control pulse signal being affected by a signal delay, it needs to reduce the wiring resistance of the metal connection line 6a and a coupling capacitance formed between the metal connection line 6a and the touch control inductive electrode 5a. According to a formula for calculating the resistance: $R=\rho \times L/S$, L denotes a length, S denotes a line cross section, p is a resistance rate, and S is in direct proportion to a wiring thickness and width. In the case where the length, thickness and resistance rate of the third metal layer 6 are not changed, in order to reduce effect on the touch control signal from the metal connection line 6a, if a width of a single metal connection line 6a is increased, the aperture rate of the display area will be reduced, and if a plurality of metal connection lines 6a are connected to one touch control inductive electrode 5a in parallel, a total wiring resistance value will be reduced, but increasing the number of the metal connection lines 6a will increase the coupling capacitance formed between the metal connection line 6a and the touch control inductive electrode 5a, and the touch control sensitivity also cannot be improved.

Thus, in structure of the in-cell touch screen, the problem desired to be solved is: how to reduce a resistance of a connection wiring of the touch control inductive electrode to improve the touch control sensitivity.

SUMMARY

In view of defects existing in the prior art, the present invention provides an in-cell touch liquid crystal panel and an array substrate thereof, wherein, by improving wiring structures of each layer disposed in the array substrate, a resistance of the connection wiring is reduced, and a touch control sensitivity is improved without increasing a coupling capacitance formed by a connection wiring and a touch control inductive electrode.

In order to achieve the above purpose, the present invention adopts the following technical solutions:

an array substrate of an in-cell touch liquid crystal panel, includes a glass substrate and a first metal layer, a second metal layer, a third metal layer and a common electrode layer that are sequentially formed on the glass substrate and are insulated with each other; a plurality of data lines extending in a first direction are disposed in the first metal layer; a plurality of data lines extending in a second direction are disposed in the second metal layer; a plurality of connection wirings extending in the first direction are disposed in the third metal layer; the common electrode layer is divided into a plurality of touch control inductive electrodes that are electrically connected to a touch control detection chip through the connection wirings; wherein, in the second metal layer, a plurality of metal lines extending in the first direction are disposed at a position corresponding to a projection of the connection wiring in the second metal layer, and between two adjacent scan lines, the metal lines and the scan lines are insulated with each other, and two ends of each metal line are electrically connected to the connection wiring located right above the meal line, respectively; wherein, the second direction and the first direction are perpendicular to each other.

Wherein, a first insulating layer is disposed between the first metal layer and the second metal layer, a second insulating layer is disposed between the second metal layer and the third metal layer, and a third insulating layer is disposed between the third metal layer and the common electrode layer.

Wherein, a fourth insulating layer and a pixel electrode layer are sequentially disposed on the common electrode layer.

Wherein, the connection wiring is connected to the touch control inductive electrode through a first through hole disposed in the third insulating layer.

Wherein, two ends of the metal line are connected to the connection wiring located right above the metal line through a second through hole disposed in the second insulating layer.

Wherein, a projection of the connection wiring in the first metal layer falls on the data line.

Wherein, within a display time of one frame, the touch control induction electrode is used to transfer common voltage and touch control signals in time-sharing.

The present invention further provides an in-cell touch liquid crystal panel, including a thin film transistor array substrate and a color filter substrate disposed opposite to each other, and further including a liquid crystal layer located between the thin film transistor array substrate and the color filter substrate, wherein, the thin film transistor array substrate is the array substrate as described above.

Compared with the prior art, in the in-cell touch liquid crystal panel and the array substrate thereof provided in the embodiment of the present invention, the first metal layer is disposed as a data line wiring layer, the second metal layer is disposed as a scan line wiring layer, and the third metal layer is disposed as a connection wiring layer of the touch control inductive electrode and located below the touch control inductive electrode. Meanwhile, a metal line is further disposed in the second metal layer, and a resistance of a connection wiring is reduced by connecting the metal line to the connection wiring of the touch control inductive electrode in parallel; moreover, a newly added metal line is located in the second metal layer, the newly added metal layer and the touch control inductive electrode located in the common electrode layer are spaced by a plurality of structure layers, and projecting relation between the metal line and the connection wiring is overlapped with each other, therefore, the added metal line affects the coupling capacitance formed between the connection wiring and the touch control inductive electrode slightly. Based on above, by improving the wiring structures of each layer disposed in the array substrate, the resistance of the connection wiring of the touch control inductive electrode is reduced, and the touch control sensitivity is improved.

DETAILED DESCRIPTION OF EXEMPLARY EMBODIMENTS

Figure 1:
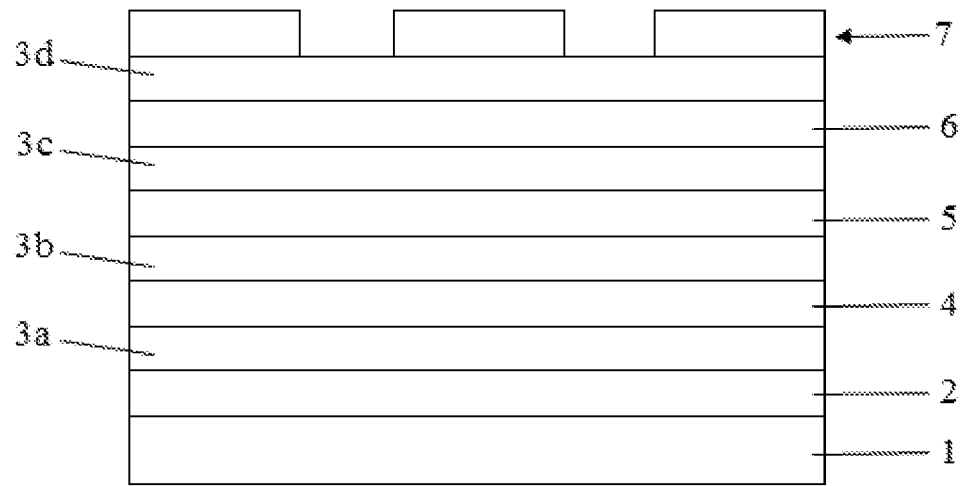
FIG. 1 is a structure schematic view of an array substrate having a touch screen structure.
Figure 2:
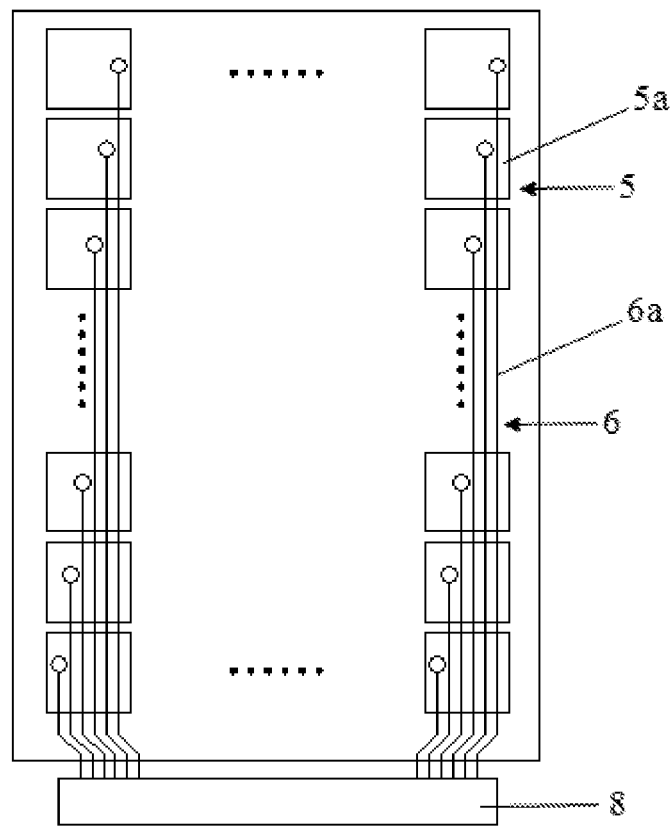
FIG. 2 is a diagram showing that a touch control inductive electrode and a metal connection line in the array substrate in FIG. 1 are connected with each other.

In order for the purpose, technical solution and advantages of the present invention to be clearer, specific embodiments of the present invention will be explained below in detail in conjunction with the drawings. Examples of these preferred embodiments were illustrated in the drawings. The embodiments of the present invention shown in the drawings and described according to the drawings are only illustrated, and the present invention is not limited to these embodiments.

Here, it also needs to explain that, in order to avoid blurring the present invention due to unnecessary details, the drawings only illustrate structures and/or processing steps closely related to the solution of the present invention, but other details having less relationship with the present invention are omitted.

Figure 3:
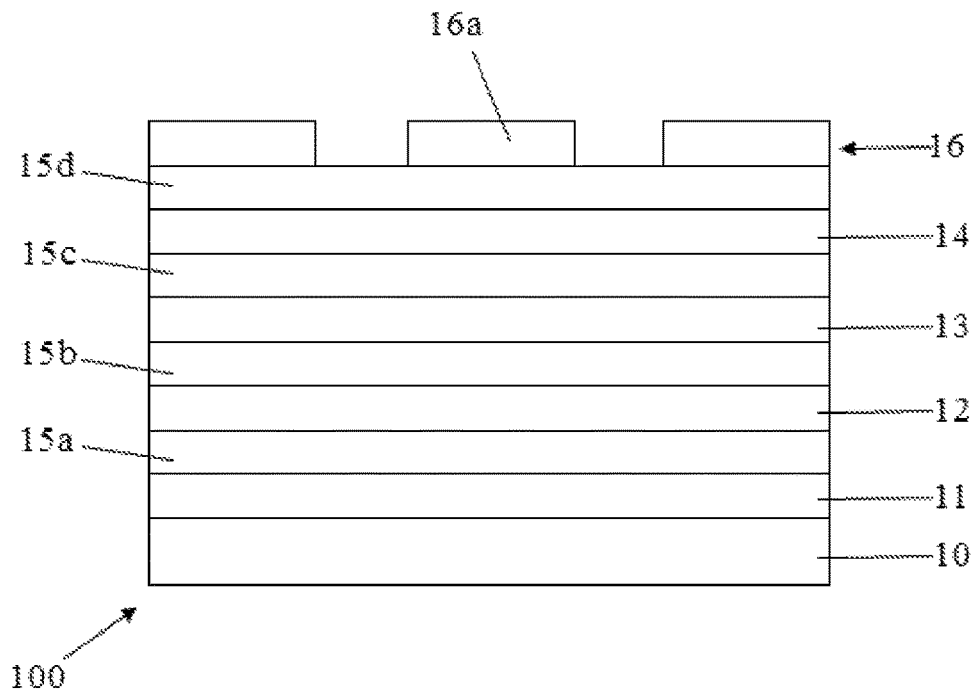
FIG. 3 is a structure schematic view of the array substrate of an in-cell touch liquid crystal panel provided by an embodiment of the present invention.

Referring to FIGS. 3-8, the present embodiment firstly provides an array substrate of an in-cell touch liquid crystal panel, and a touch structure is embedded in a thin film transistor array substrate. As shown in FIG. 3, the array substrate 100 includes a glass substrate 10 and a first metal layer 11, a second metal layer 12, a third metal layer 13 and a common electrode layer 14 that are sequentially formed on the glass substrate 10 and are insulated with each other; a first insulating layer 15a is disposed between the first metal layer 11 and the second metal layer 12, a second insulating layer 15b is disposed between the second metal layer 12 and the third metal layer 13, and a third insulating layer 15c is disposed between the third metal layer 13 and the common electrode layer 14. Furthermore, a fourth insulating layer 15d and a pixel electrode layer 16 are sequentially disposed on the common electrode layer 14, and the pixel electrode layer 16 includes a plurality of pixel electrodes 16a.

Figure 4:
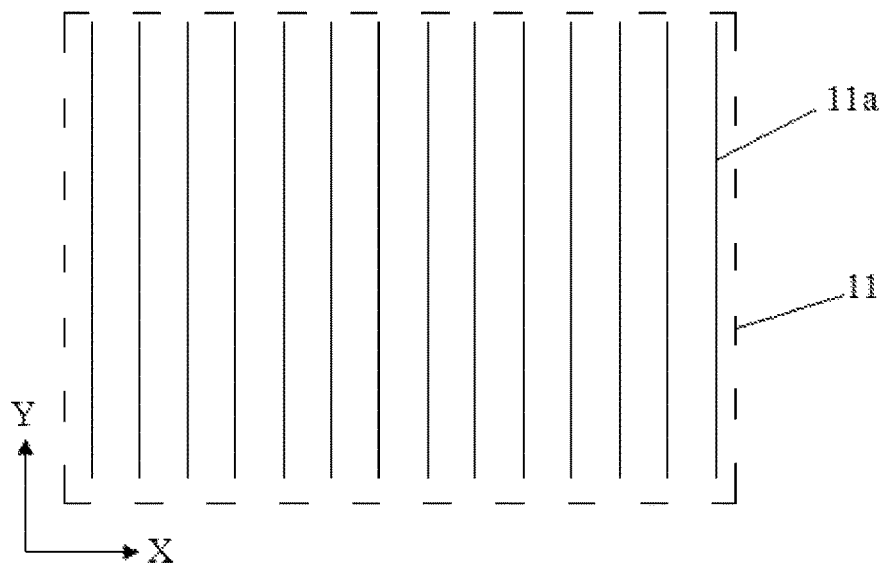
FIG. 4 is a structure schematic view of a first metal layer in an embodiment of the present invention.
Figure 5:
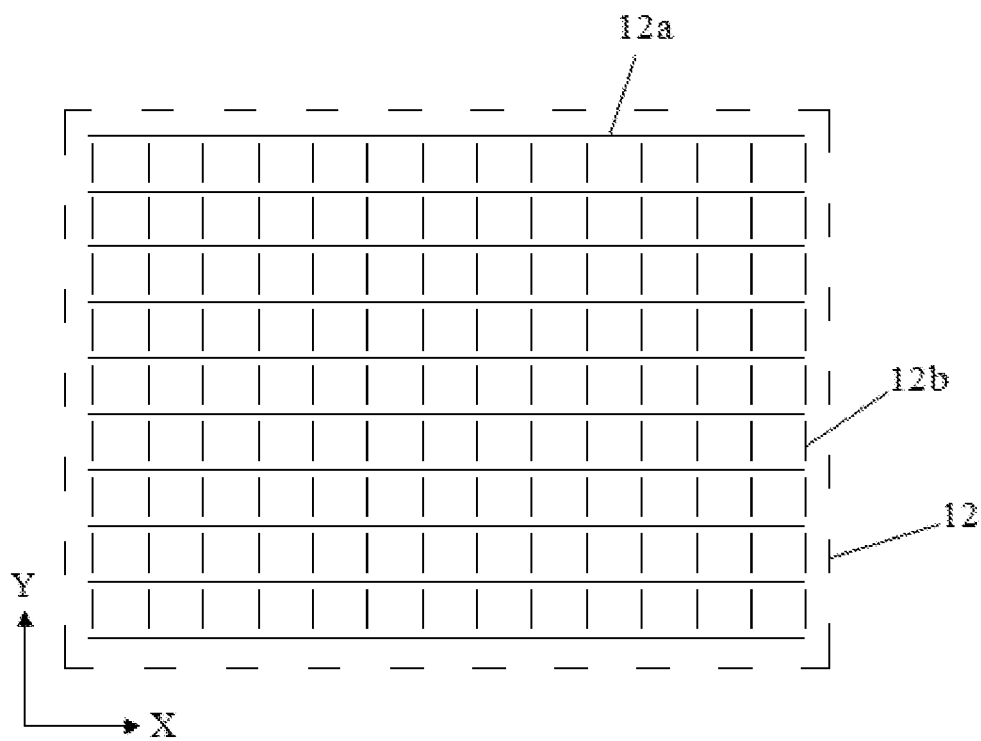
FIG. 5 is a structure schematic view of a second metal layer in an embodiment of the present invention.
Figure 6:
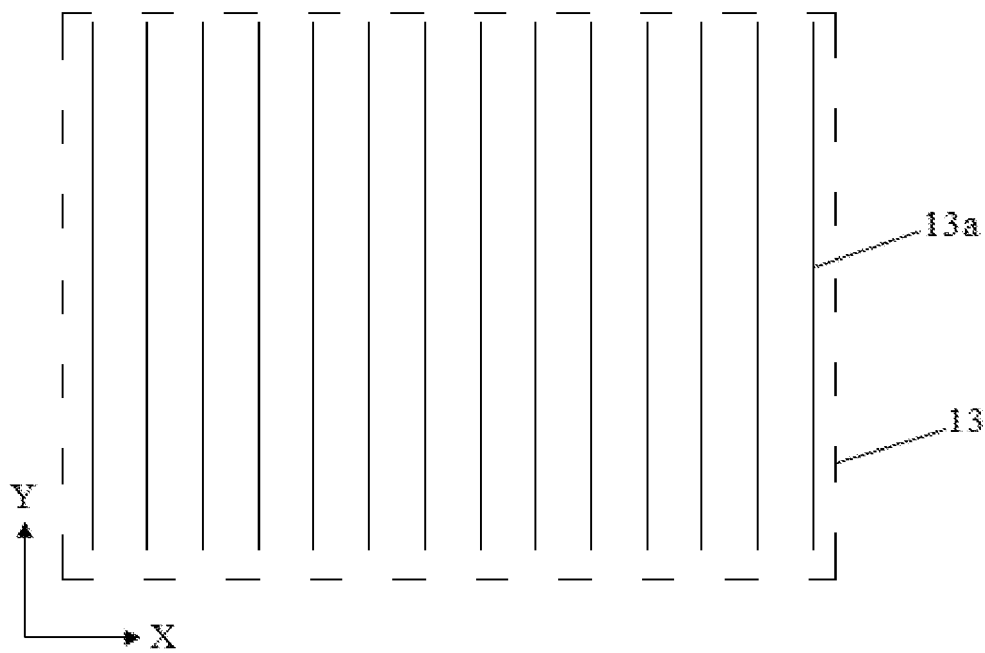
FIG. 6 is a structure schematic view of a third metal layer in an embodiment of the present invention.
Figure 7:
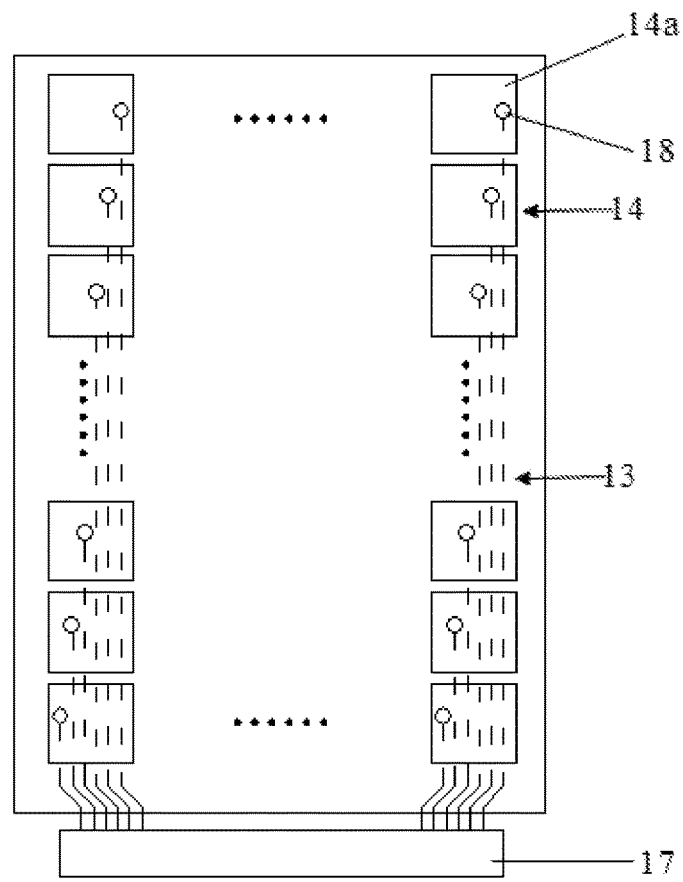
FIG. 7 is a diagram showing that a touch control inductive electrode and a connection wiring are connected with each other in an embodiment of the present invention.

Wherein, as shown in FIG. 4, a plurality of data lines 11a extending in a first direction (a Y direction as shown in FIG. 4) are disposed in the first metal layer 11; and the data lines 11a are used to provide data signals to pixel units in the array substrate 100. It needs to explain that, one pixel unit in the array substrate 100 usually includes a thin film transistor (not shown in the figures) and a pixel electrode 16a. As shown in FIG. 5, a plurality of scan lines 12a extending in a second direction (an X direction as shown in FIG. 5) are disposed in the second metal layer 12; and the scan lines 12a are used to provide scan signals to the pixel units in the array substrate 100. As shown in FIG. 6, a plurality of connection wirings 13a extending in a first direction (a Y direction as shown in FIG. 6) are disposed in the third metal layer 13; and the connection wirings 13a are used to transfer touch control signals. As shown in FIG. 7, the common electrode layer 14 is divided into a plurality of touch control inductive electrodes 14a that are arranged in arrays to form an embedded touch structure, and electrically connected to an external touch control detection chip 17 through the connection wirings 13a in the third metal layer 13, wherein, the connection wirings 13a in FIG. 7 are indicated by using dotted lines, which is mainly for explaining that the third metal layer 13 is located below the common electrode layer 14 relatively; furthermore, referring to FIG. 7, the connection wiring 13a is connected to the touch control inductive electrode 14a through a first through hole 18 disposed in the third insulating layer 15c (not shown in FIG. 7). Wherein, since the common electrode layer 14 is also used as a touch control inductive electrode 14a, in a display time of one frame, the touch control inductive electrode 14a transfers common voltage ($V_{com}$) and touch control signals in time-sharing. In the figures, the X direction and the Y direction are perpendicular to each other.

It needs to explain that, FIG. 6 mainly shows an arranging manner and an extending direction of the connection wirings 13a, and thus, lengths of the connection wirings 13a shown in FIG. 6 are equal. However, in the practical structures, referring to FIG. 7, the lengths of the connection wirings 13a that are connected to different touch control inductive electrodes 14a are likely different. In addition, referring to FIGS. 4 and 6, the extending direction of the connection wiring 13a in the third metal layer 13 is consistent with the extending direction of the data line 11a in the first metal layer 11 (the Y direction as shown in FIGS. 4 and 6), also, in order not to affect the aperture rate of the display area, a projection of the connection wiring 13a in the first metal layer 11 should fall on the data line 11a.

Figure 8:
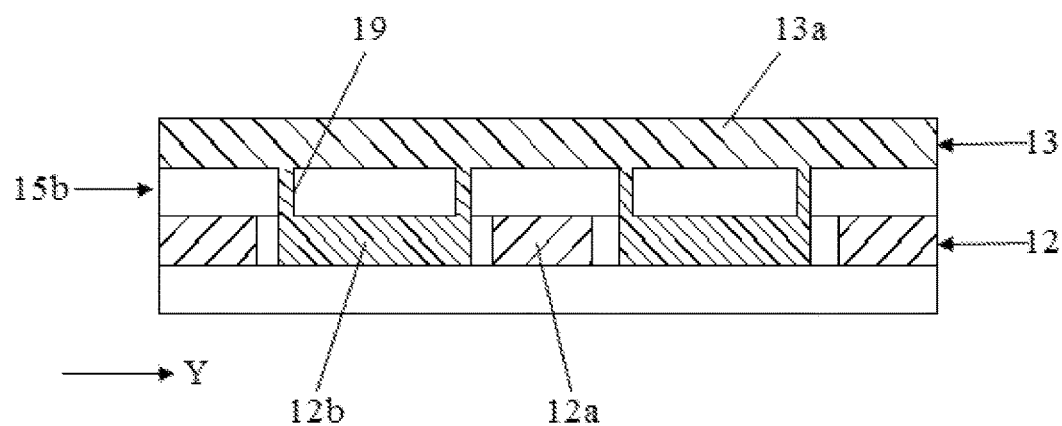
FIG. 8 is a structure schematic view of a metal line and a connection wiring being connected with each other in an embodiment of the present invention.

In the present embodiment, referring to FIGS. 5 and 8, in the second metal layer 12, a plurality of metal lines 12b extending in the first direction (the Y direction in FIGS. 5 and 8) are disposed at a position corresponding to the projection of the connection wiring 13a in the second metal layer 12, and between two adjacent scan lines 12a, the metal lines 12b and the scan lines 12a are insulated with each other (gaps exists between each of two ends of each metal line 12b and the adjacent scan lines 12a), and two ends of each metal line 12b are electrically connected to the connection wiring 13a located right above the meal line 12b, respectively. In specific, two ends of the metal line 12b are connected to the connection wiring 13a located right above the metal line 12b through a second through hole 19 disposed in the second insulating layer 15b. A newly added metal line 12b is connected to the connection wiring 13a of the touch control induction electrode 14a in parallel, and thus, a resistance of the connection wiring 13a is reduced; moreover, the newly added metal line 12b is located in the second metal layer 12, the newly added metal layer 12b and the touch control inductive electrode 14a located in the common electrode layer 14 are spaced by a plurality of structure layers, and projecting relation between the metal line 12b and the connection wiring 13a is overlapped with each other, therefore, the added metal line 12b affects the coupling capacitance formed between the connection wiring 13a and the touch control inductive electrode 14a slightly. Therefore, the added metal line 12b in the second metal layer 12 can improve the touch control sensitivity.

Figure 9:
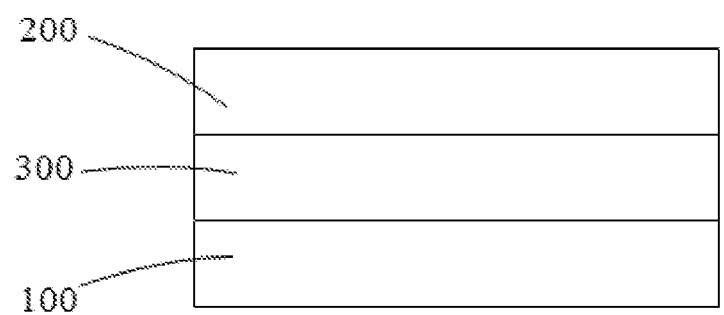
FIG. 9 is a structure schematic view of an in-cell touch liquid crystal panel provided by an embodiment of the present invention.

The present embodiment further provides an in-cell touch liquid crystal panel, as shown in FIG. 9, the in-cell touch liquid crystal panel includes the thin film transistor array substrate 100 provided in the aforesaid embodiment, and further includes a color filter substrate 200 disposed opposite to the array substrate 100, and a liquid crystal layer 300 disposed between the array substrate 100 and the color filter substrate 200.

In summary, the in-cell touch liquid crystal panel and the array substrate thereof provided by the embodiments of the present invention, by improving wiring structures of each layer disposed in the array substrate, reduce a resistance of the connection wiring, and improve a touch control sensitivity without increasing a coupling capacitance formed between a connection wiring and a touch control inductive electrode.

It should be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further include inherent factors for this process, method, object or device. In the case where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without breaking away from the principle of the present application, also those improvements and polish should be considered as the protection scope of the present application.

The invention claimed is:

1. An array substrate of an in-cell touch liquid crystal panel, comprising a glass substrate and a first metal layer, a second metal layer, a third metal layer and a common electrode layer that are sequentially formed on the glass substrate and are insulated with each other;

a plurality of data lines extending in a first direction being disposed in the first metal layer;

a plurality of scan lines extending in a second direction being disposed in the second metal layer;

a plurality of connection wirings extending in the first direction being disposed in the third metal layer;

the common electrode layer being divided into a plurality of touch control inductive electrodes that are electrically connected to a touch control detection chip through the connection wirings, wherein a plurality of metal lines extending in the first direction being disposed in the second metal layer between two adjacent scan lines, the metal lines are disposed at positions corresponding to projections of the connection wirings in the second metal layer respectively, the metal lines and the scan lines are insulated with each other, and two ends of each metal line are electrically connected to the connection wiring located right above the meal line respectively; and wherein, the second direction and the first direction are perpendicular to each other.

2. The array substrate of claim 1, wherein, a first insulating layer is disposed between the first metal layer and the second metal layer, a second insulating layer is disposed between the second metal layer and the third metal layer, and a third insulating layer is disposed between the third metal layer and the common electrode layer.

3. The array substrate of claim 2, wherein, a fourth insulating layer and a pixel electrode layer are sequentially disposed on the common electrode layer.

4. The array substrate of claim 2, wherein, the connection wiring is connected to the touch control inductive electrode through a first through hole disposed in the third insulating layer.

5. The array substrate of claim 2, wherein, two ends of the metal line are connected to the connection wiring located right above the metal line through a second through hole disposed in the second insulating layer.

6. The array substrate of claim 1, wherein, a projection of the connection wiring in the first metal layer falls on the data line.

7. The array substrate of claim 5, wherein, a projection of the connection wiring in the first metal layer falls on the data line.

8. The array substrate of claim 1, wherein, within a display time of one frame, the touch control induction electrode is used to transfer common voltage and touch control signals in time-sharing.

9. An in-cell touch liquid crystal panel, comprising a thin film transistor array substrate and a color filter substrate disposed opposite to each other, and further comprising a liquid crystal layer located between the thin film transistor array substrate and the color filter substrate, wherein, the thin film transistor array substrate comprises a glass substrate and a first metal layer, a second metal layer, a third metal layer and a common electrode layer that are sequentially formed on the glass substrate and are insulated with each other;

a plurality of data lines extending in a first direction being disposed in the first metal layer;

a plurality of scan lines extending in a second direction being disposed in the second metal layer;

a plurality of connection wirings extending in the first direction being disposed in the third metal layer;

the common electrode layer being divided into a plurality of touch control inductive electrodes that are electrically connected to a touch control detection chip through the connection wirings, wherein a plurality of metal lines extending in the first direction being disposed in the second metal layer between two adjacent scan lines, the metal lines are disposed at positions corresponding to projections of the connection wirings in the second metal layer respectively, the metal lines and the scan lines are insulated with each other, and two ends of each metal line are electrically connected to the connection wiring located right above the meal line respectively; and wherein, the second direction and the first direction are perpendicular to each other.

10. The in-cell touch liquid crystal panel of claim 9, wherein, a first insulating layer is disposed between the first metal layer and the second metal layer, a second insulating layer is disposed between the second metal layer and the third metal layer, and a third insulating layer is disposed between the third metal layer and the common electrode layer.

11. The in-cell touch liquid crystal panel of claim 10, wherein, a fourth insulating layer and a pixel electrode layer are sequentially disposed on the common electrode layer.

12. The in-cell touch liquid crystal panel of claim 10, wherein, the connection wiring is connected to the touch control inductive electrode through a first through hole disposed in the third insulating layer.

13. The in-cell touch liquid crystal panel of claim 10, wherein, two ends of the metal line are connected to the connection wiring located right above the metal line through a second through hole disposed in the second insulating layer.

14. The in-cell touch liquid crystal panel of claim 9, wherein, a projection of the connection wiring in the first metal layer falls on the data line.

15. The in-cell touch liquid crystal panel of claim 13, wherein, a projection of the connection wiring in the first metal layer falls on the data line.

16. The in-cell touch liquid crystal panel of claim 9, wherein, within a display time of one frame, the touch control induction electrode is used to transfer common voltage and touch control signals in time-sharing.

* * * * *